(12) United States Patent
Leifso

(10) Patent No.: US 7,978,785 B2
(45) Date of Patent: Jul. 12, 2011

(54) QUADRATURE FREQUENCY DOUBLER WITH ADJUSTABLE PHASE OFFSET

(75) Inventor: Curtis Leifso, Ottawa (CA)

(73) Assignee: Edgewater Computer Systems, Inc. (CA)

( * ) Notice: Subject to any disclaimer, the term of this patent is extended or adjusted under 35 U.S.C. 154(b) by 1088 days.

(21) Appl. No.: 11/677,400

(22) Filed: Feb. 21, 2007

(65) Prior Publication Data

US 2008/0030244 A1    Feb. 7, 2008

Related U.S. Application Data

(60) Provisional application No. 60/821,252, filed on Aug. 2, 2006.

(51) Int. Cl.
*H03B 19/00* (2006.01)
(52) U.S. Cl. ......................................... 375/302; 327/122
(58) Field of Classification Search .................. 375/259, 375/298, 302, 308; 327/122
See application file for complete search history.

(56) References Cited

U.S. PATENT DOCUMENTS 6,564,045 B1 * 5/2003 Fransis .......................... 455/318

\* cited by examiner

*Primary Examiner* — David B Lugo
(74) *Attorney, Agent, or Firm* — Hayes Soloway P.C.

(57) ABSTRACT

The present invention provides an improved frequency doubling circuit, with adjustable phase offset. Briefly, rather than using the traditional equations $\cos(2\omega t) = \cos 2(\omega t) - \sin 2(\omega t)$ and $\sin(2\omega t) = 2\sin(\omega t)\cos(\omega t)$, the quadrature output signals are generated utilizing mixers, each having two input signals, separated in phase by the same offset. This minimizes the effects of the non-linearities introduced by the mixer, which therefore reduces amplitude mismatch between the quadrature signals. Also, the phase offset of the quadrature output signals can be tuned and calibrated using a phase shifting circuit. This phase shifting circuit realizes a tuning range of approximately 5° in programmable steps. This combination of circuits can be used to minimize the amplitude mismatch and phase errors, thereby reducing the amplitude of and interference caused by transmission of the image frequency to the receivers input.

17 Claims, 8 Drawing Sheets

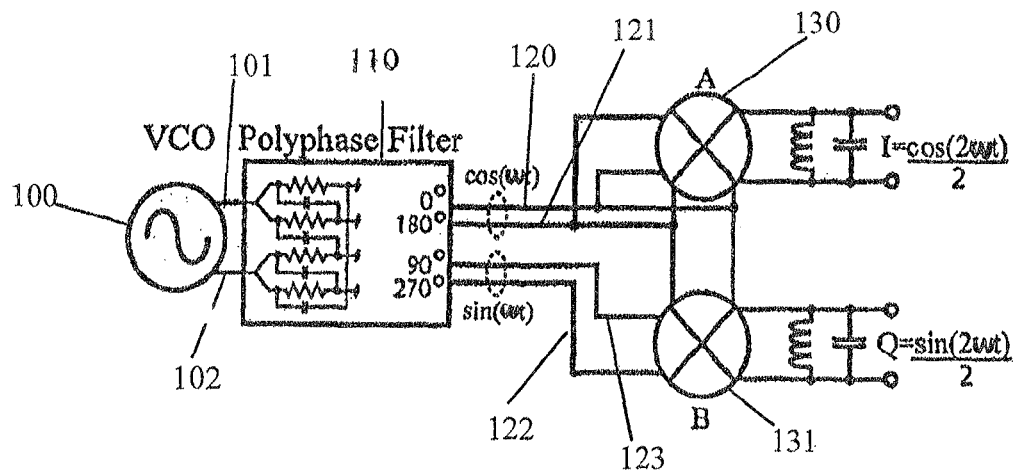
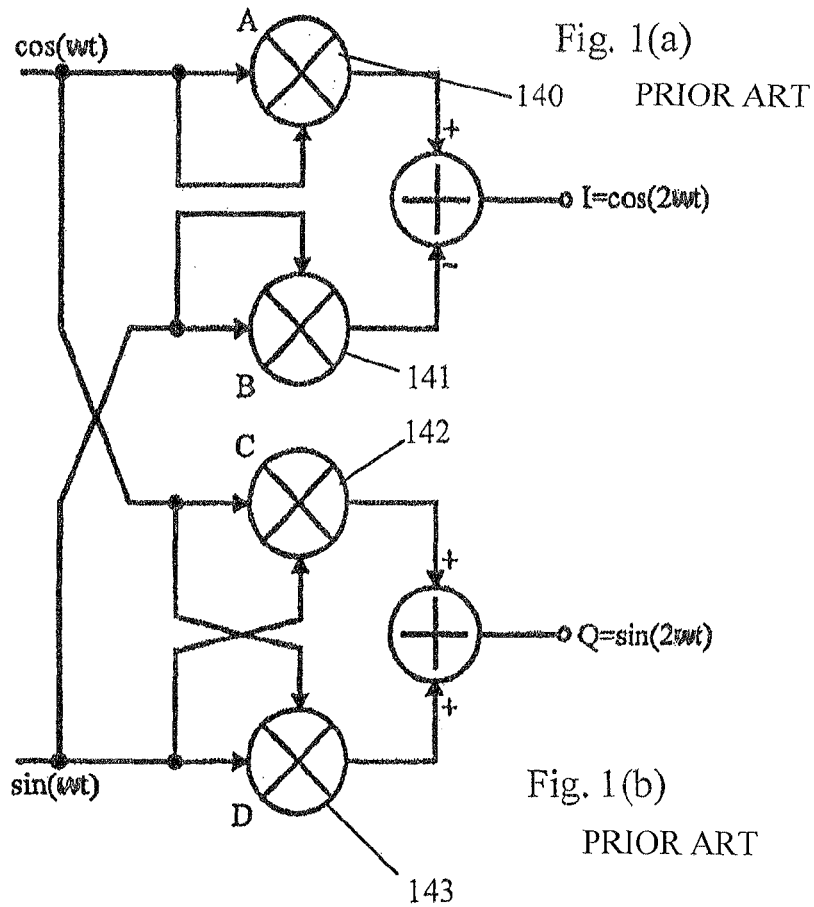
Fig. 1 (a) Simple quadrature frequency doubler; and Fig. 1(b) Modified doubler with no DC offset and balanced polyphase filter load.

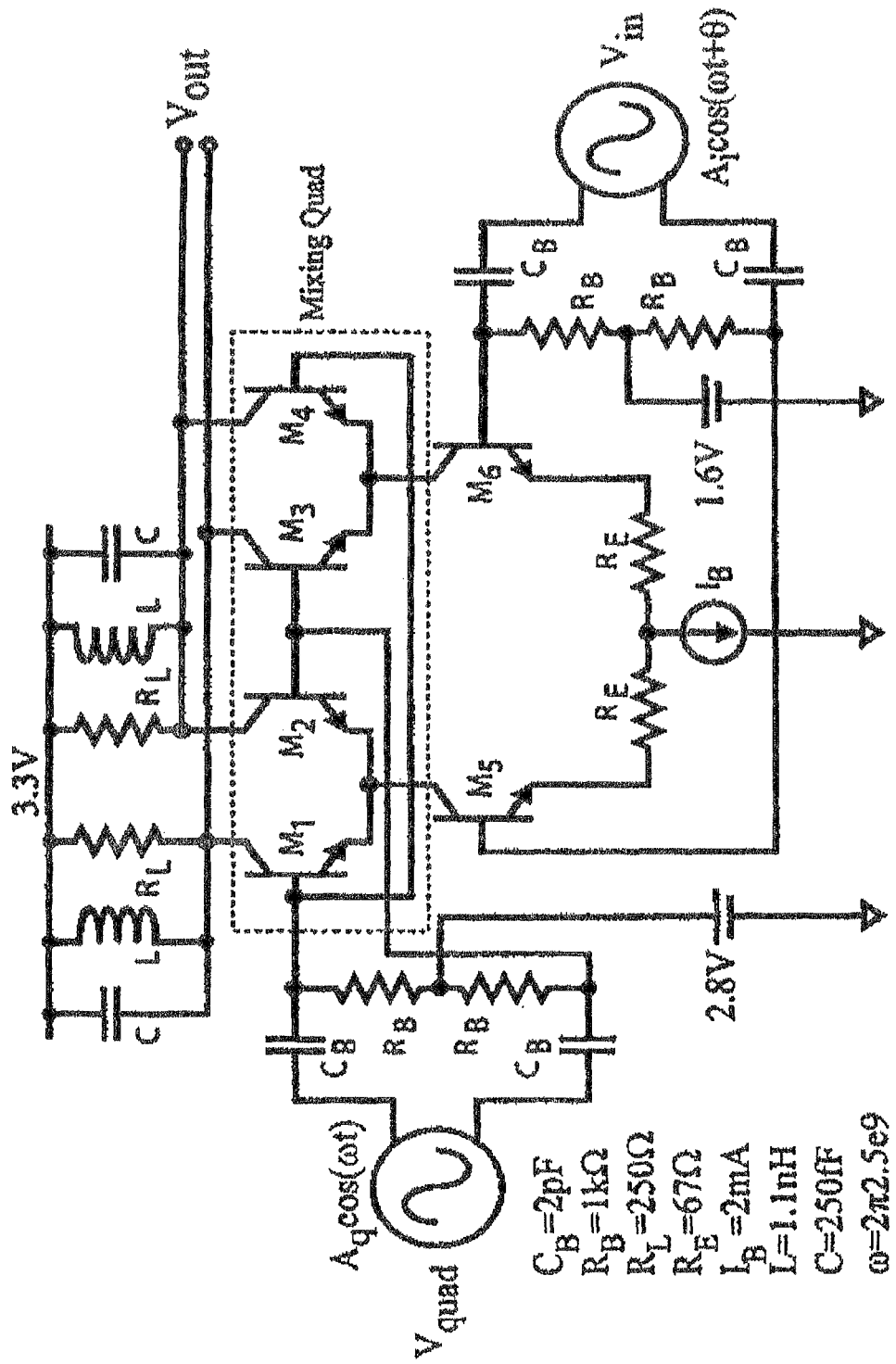
Fig. 2. Gilbert Mixer
PRIOR ART

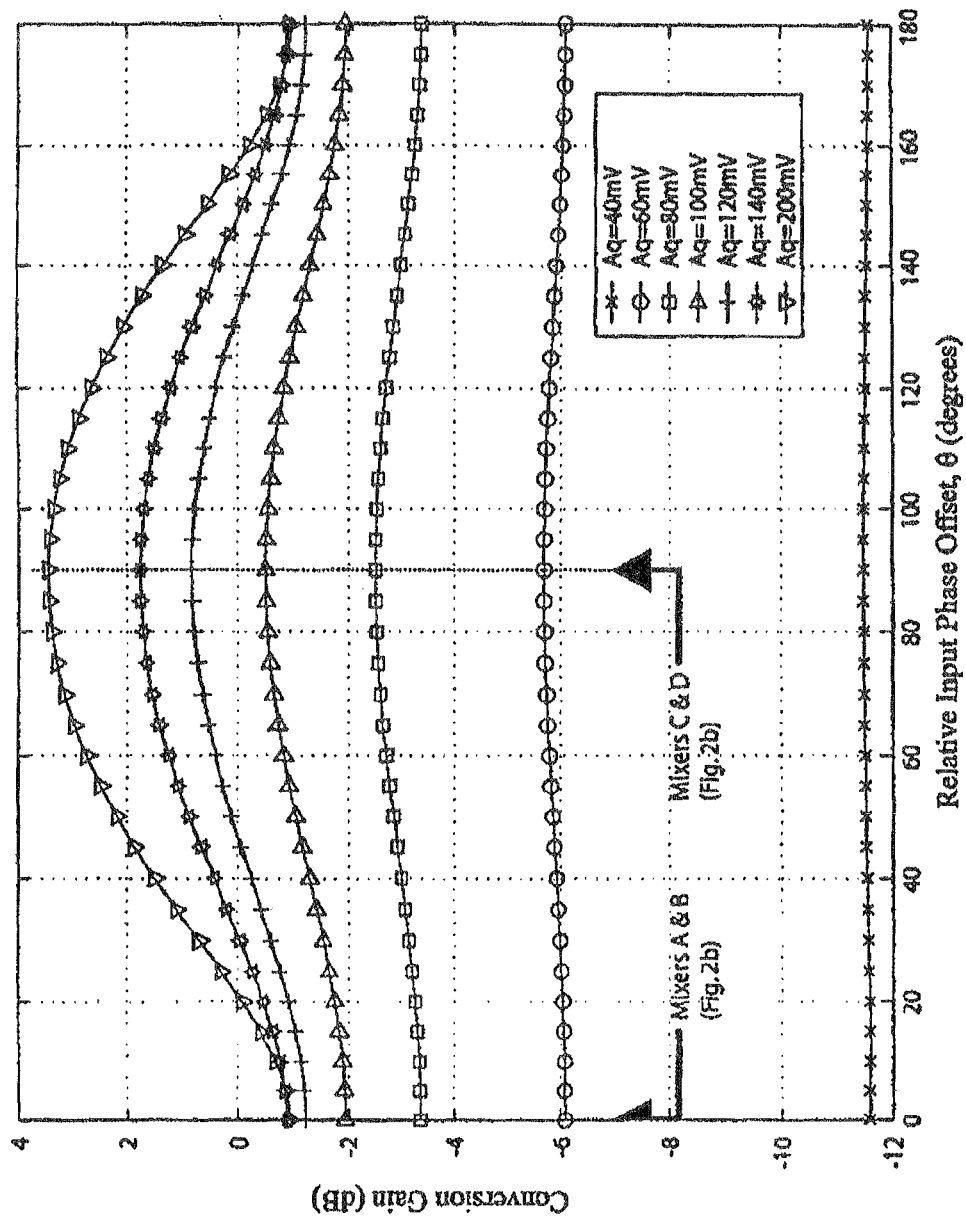
Fig. 3. Mixer conversion gain dependency on relative input phase offset.

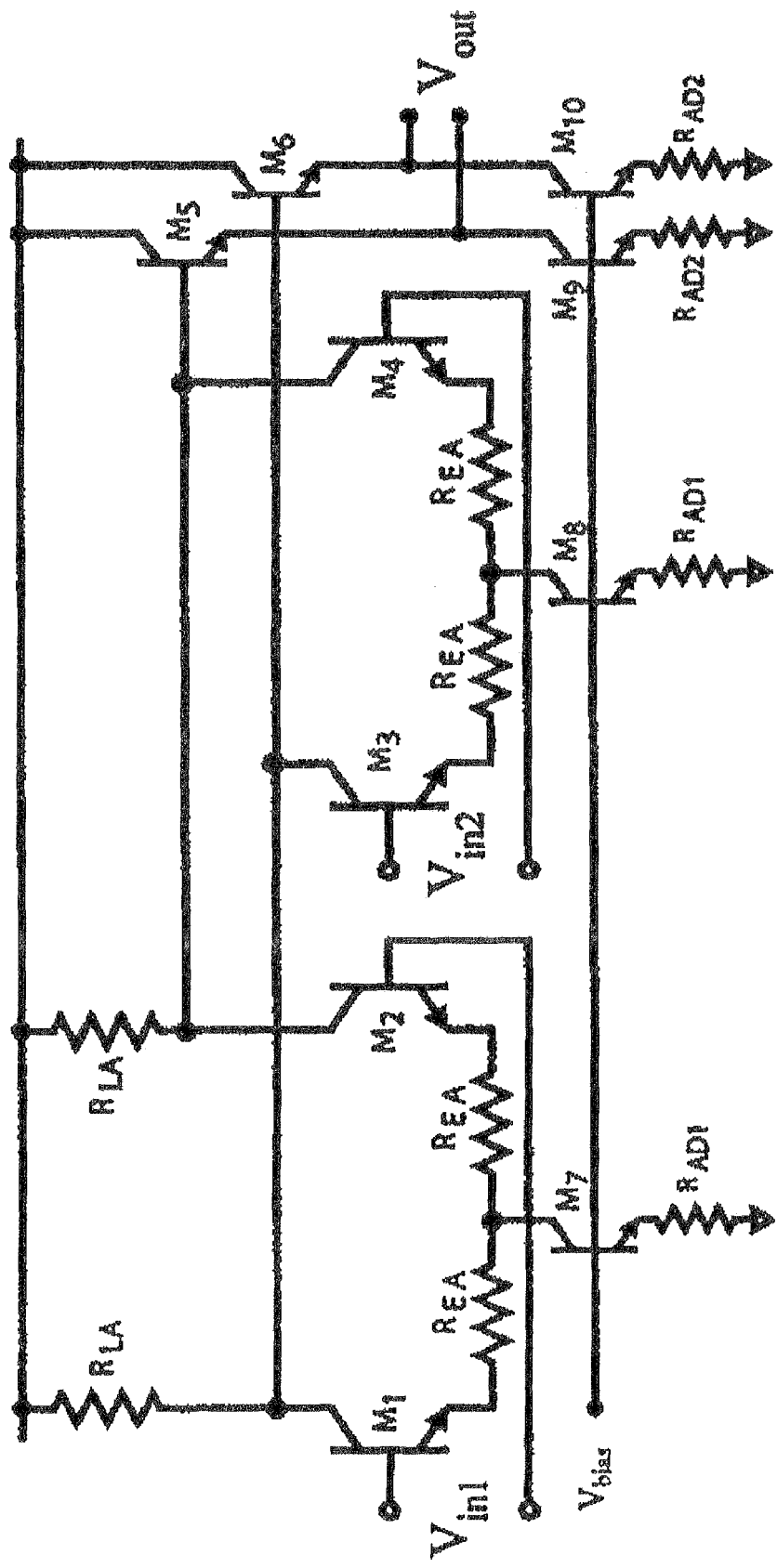
Fig. 5. Adder implementation

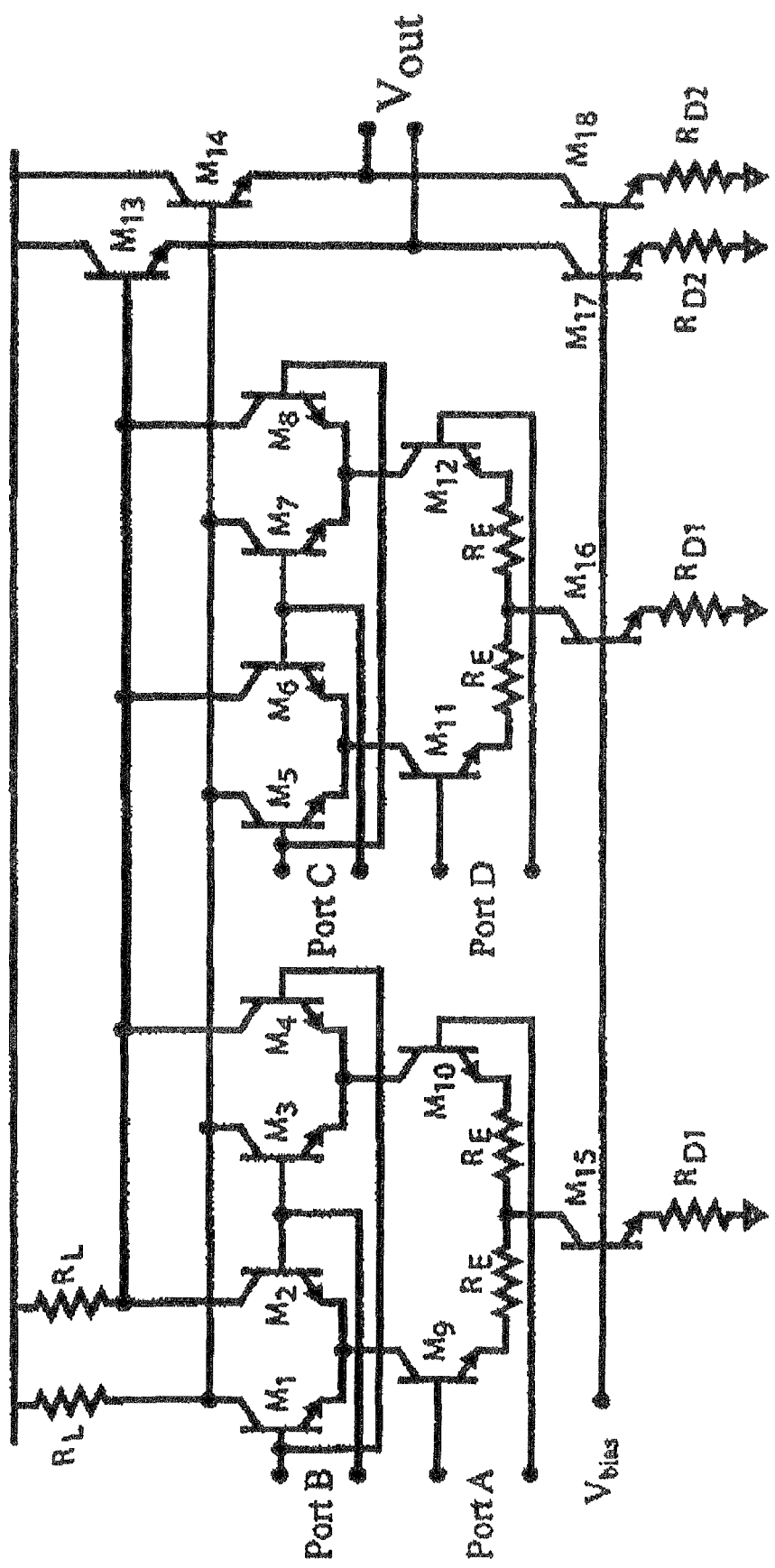
Fig. 6. Single-sideband mixer schematic

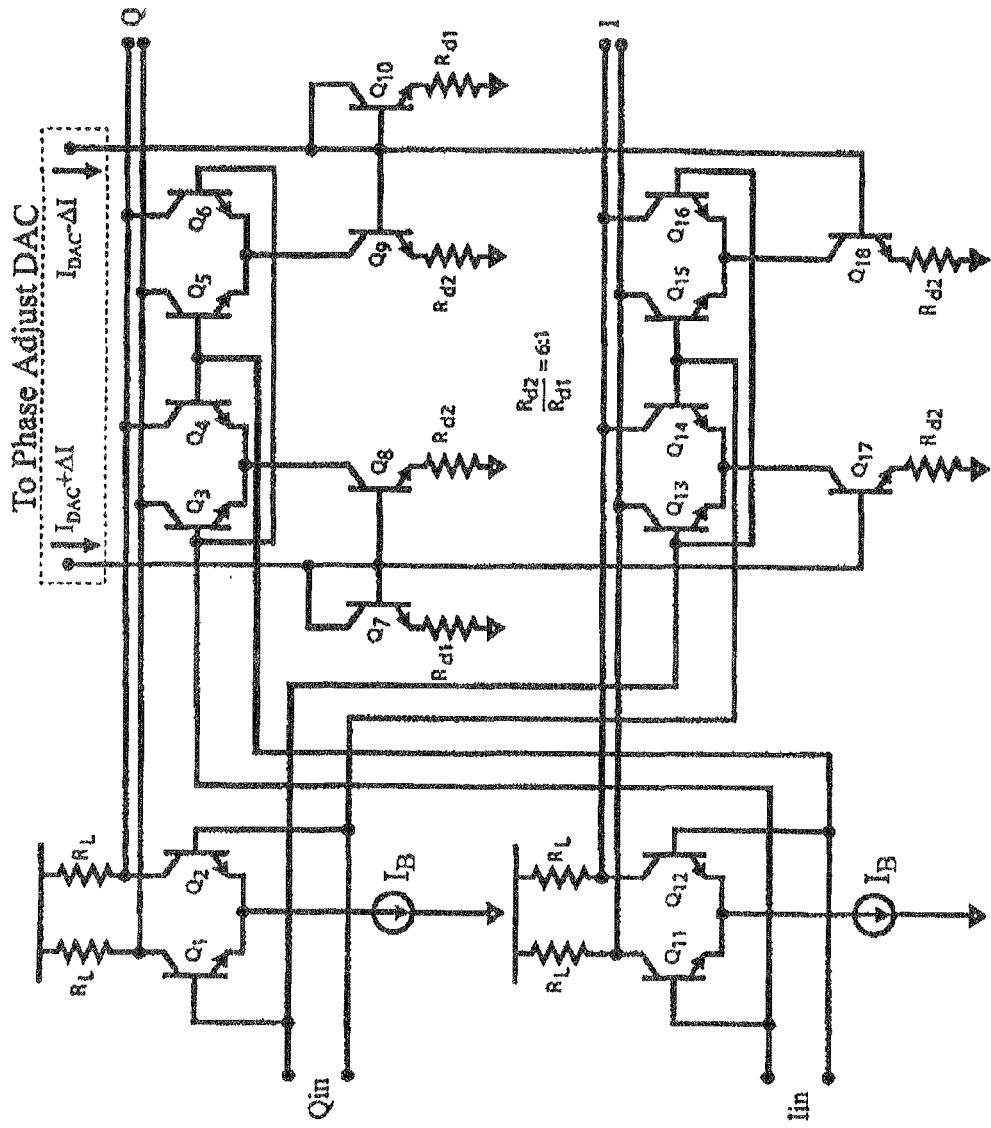
Fig. 7 Phase shifter schematic

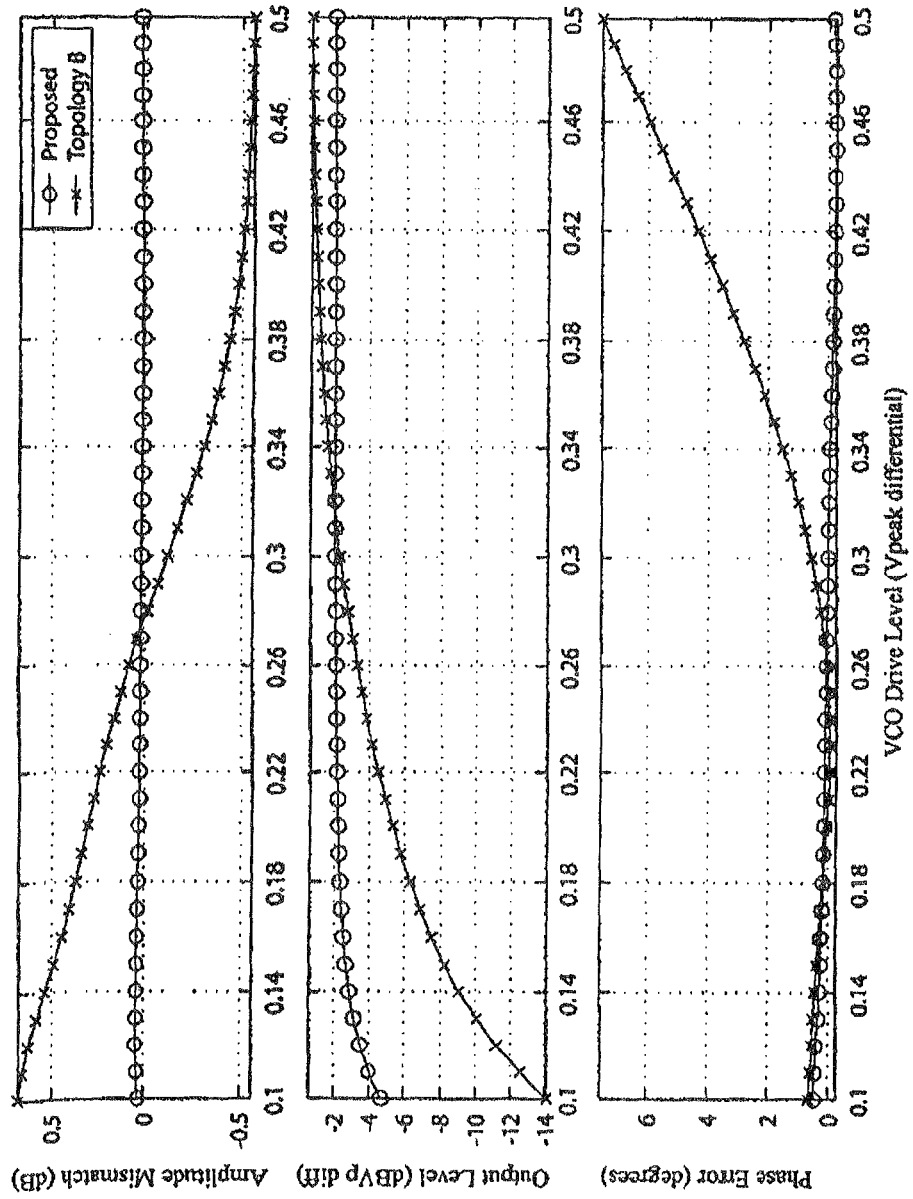
Fig. 8. Simulated input amplitude sensitivity of topology in Fig. 2b (topology b) in comparison to the proposed design

QUADRATURE FREQUENCY DOUBLER WITH ADJUSTABLE PHASE OFFSET

CROSS-REFERENCE TO RELATED APPLICATIONS

This application claims benefit from U.S. Provisional Patent Application Ser. No. 60/821,252 filed on Aug. 2, 2006, the entire content of which is incorporated herein by reference.

BACKGROUND OF THE INVENTION

Full-duplex RF front-ends in WLAN networks require careful design to limit receive desensitization due to transmit noise and transmit error vector magnitude (EVM) degradation caused by receiver local oscillator (LO) leakage to the transmit path. In addition, frequency pulling is a concern in full duplex systems where receive and transmit voltage-controlled oscillators (VCOs) must operate simultaneously and be close in frequency.

As a consequence, such full-duplex systems and many other applications, require two driving signals, typically referred to as I and Q or quadrature signals, having the same frequency and having their phases in quadrature with each other, i.e. presenting a relative phase offset of 90°. It is important that these quadrature signals I and Q are balanced in amplitude, i. e. have substantially the same amplitude, and that the phase error from the desired 90° phase shift is as small as possible.

Such signals are commonly generated by frequency doublers. However, many state-of-the-art frequency doubling circuits introduce amplitude mismatch and quadrature phase offset between the quadrature signals.

FIG. 1a illustrates a state-of-the-art frequency doubler producing quadrature signals. A voltage controlled oscillator (VCO) 100 is used to create a differential sinusoidal output 101 and 102. These signals are input into a polyphase filter 110, which is an arrangement of resistors and capacitors interconnected in such a way so as to produce two quadrature differential outputs. Outputs 120 and 121 are referred to as cos(ωt) and −cos(ωt), respectively, while outputs 122 and 123 are referred to as sin (ωt) and −sin(ωt), respectively. In mixer 130, the cos(ωt) terms are multiplied together, yielding cos (2ωt). Since cos(2ωt)=2 cos(ωt)−1, the output of mixer 130 is equal to ½ cos(2ωt)+½. In this scheme, the mixing term resulting from squaring the polyphase filters in-phase signal (mixer A 130) will have a DC offset, preferably removed with a tuned load to ensure matched mixer bias conditions and minimal phase error. Unfortunately, tuned loads consume die space and limit circuit bandwidth. Also, the outputs of the polyphase filter are not equally loaded. This unbalanced loading leads to quadrature phase error.

An attempt to address the issues of having a bulky tank circuit and an unbalanced polyphase filter load present with the doubler in FIG. 1a are addressed via the topology shown in FIG. 1b. In this embodiment, mixer 140 multiplies cos(ωt) by itself, yielding cos²(ωt). Mixer 141 multiplies sin(ωt) by itself, yielding sin²(ωt). The output of mixer 141 is subtracted from the output of mixer 140, yielding $$I = \cos^2(\omega t) - \sin^2(\omega t) = \cos(2\omega t)$$

Similarly, mixer 142 and mixer 143 both multiply sin(ωt) by cos(ωt), yielding sin(ωt)cos(ωt). These terms are summed yielding $$Q = 2\sin(\omega t)\cos(\omega t) = \sin(2\omega t)$$

However, the circuit in FIG. 1b introduces considerable amplitude imbalance when mixer non-linearities are considered. This occurs because the conversion gain of each mixer is a function of the relative phase offset of its input signals.

The dependence of the conversion gain on the relative phase offset can be explained by way of example considering a simple Gilbert mixer implementation as in FIG. 2. In this Gilbert mixer, the output voltage, $V_{out}$ can be expressed as a function of the two input voltages, $V_{quad}$ and $V_{in}$, as follows:

$$V\text{out} = (R_L V_{in}/R_E) \tan h(V_{quad}/2V_T)$$

where $V_T$ is the thermal voltage of the transistor, given by kT/q.

Returning to FIG. 1b, assume that each of the mixers 140-143 is implemented as a Gilbert mixer. Mixers 140 and 141 each multiply a signal by itself thus their inputs are in-phase, while mixers 142 and 143 multiply two signals which are in quadrature. Thus the peak output of mixers 140 and 141 occurs when the input sinusoid achieves its peak value. At the input peak, the tan h($V_{quad}/2V_T$) term in (1) introduces compression due to the nonlinearity of the mixing quad devices M1 to M4 in FIG. 2, when $V_{quad} >> V_T$.

On the other hand, mixers 142 and 143 reach their maximum value when each of its inputs are at 1/√2 of their peak value. The harmonics introduced by the mixing quad compression are dependent upon the input phase such that when vector summed to give the mixer output, the conversion gain will be higher for orthogonal inputs compared to when the two inputs are in-phase. The result is that the amplitude of the I output will be lower than the amplitude of the Q output, an unacceptable imbalance when used in a doubler design to provide the LO in an image reject mixer.

FIG. 3 illustrates the simulated conversion gain (with respect to the input port, $V_{in}$) of the Gilbert mixer shown in FIG. 2 as a function of the phase offset, θ, at its input ports. $A_q$ is the peak differential drive level on the mixing quad while $A_i$ is held constant at 100 mV. For low input levels where $A_q << V_T$, tan h ($V_{quad}/2V_T$)=$V_{quad}/2V_T$ and the conversion gain shows minimal sensitivity to input phase. This implies drive levels too low to be useful for driving mixer LO ports, and subsequently a high noise floor. As $A_q$ is increased, the conversion gain begins to saturate with respect to the quad drive level but exhibits increasing phase sensitivity. As shown, the worst case mismatch occurs when the input sinusoids are in quadrature, as used in the doubler topology shown in FIG. 1b.

The zero crossings at each differential pair in the mixer are not affected by the mixing quad nonlinearity and hence a phase error is not introduced. In practice large signal effects in the presence of this nonlinearity will cause mixer imbalances resulting in slight phase offsets.

If the topology in FIG. 1b is used, the outputs will exhibit amplitude imbalance proportional to the drive level at the polyphase filter input owing to the aforementioned mixer nonlinearities.

To minimize the mixer distortion, one approach has been to attempt to linearize each mixer's conversion gain with respect to the mixer quad inputs. Knowing that the output of the Gilbert mixer is proportional to tan h ($V_{quad}$), the mixer output can be linearized by applying an inverse tan h function to predistort the $V_{quad}$ input. However, this approach presupposes a wide dynamic range predistortion circuit. Process variations will cause such a circuit to contribute to output phase and amplitude imbalance.

Therefore, an improved frequency doubling circuit is needed to reduce the amplitude imbalance between quadrature signals. Such a circuit would minimize transmissions occurring at the image frequency, thereby improving the receiver performance of a wireless communication device. Additional, although amplitude mismatch is a major source of error, phase offset between the quadrature signals represents another source of error. Thus, a phase shifter circuit that reduces the phase error between two quadrature signals can further minimize transmissions occurring at the image frequency. A method of calibrating such a phase shifter to compensate for process, temperature and supply voltage variation would provide further advantages.

SUMMARY OF THE INVENTION

A frequency doubler circuit and a frequency doubling method are provided. The frequency doubler circuit comprising an adder block, a first mixer block and a second mixer block. The adder block produces a plurality of intermediate phase shifted signals of frequency $\omega$ based on input differential quadrature signals of frequency $\omega$. The two mixer blocks receive the intermediate phase shifted signals and produce in-phase signal $I_{in}$ of frequency $2\omega$ and quadrature signal $Q_{in}$ of frequency $2\omega$.

In accordance to a preferred embodiment, the frequency doubler of the present invention further comprises a phase shifter for further reducing phase errors between the two quadrature signals of frequency $2\omega$.

A frequency doubling method and a phase shifting method are also provided.

Advantageously, the frequency doubler circuit and frequency doubling method of the preferred embodiments of the invention produce quadrature signals of substantially same amplitude and with minimal phase error form the desired phase quadrature relationship.

BRIEF DESCRIPTION OF THE DRAWINGS

FIGS. 1a and 1b illustrate two embodiments of frequency doubling circuits in the prior art;

FIG. 2 illustrates one embodiment of a Gilbert mixer in the prior art;

FIG. 3 represents a graph illustrating the effect of phase offset to amplitude in the Gilbert mixer of FIG. 2;

FIG. 5 illustrates an embodiment of the adder used in FIG. 4;

FIG. 6 illustrates an embodiment of the single-sideband mixer used in FIG. 4;

FIG. 7 illustrates an embodiment of the phase shifter used in FIG. 4; and

FIG. 8 illustrates the performance metrics of embodiments of the invention according to FIGS. 4-7 compared to the circuit in FIG. 1b.

DETAILED DESCRIPTION OF THE INVENTION

Figure 4:
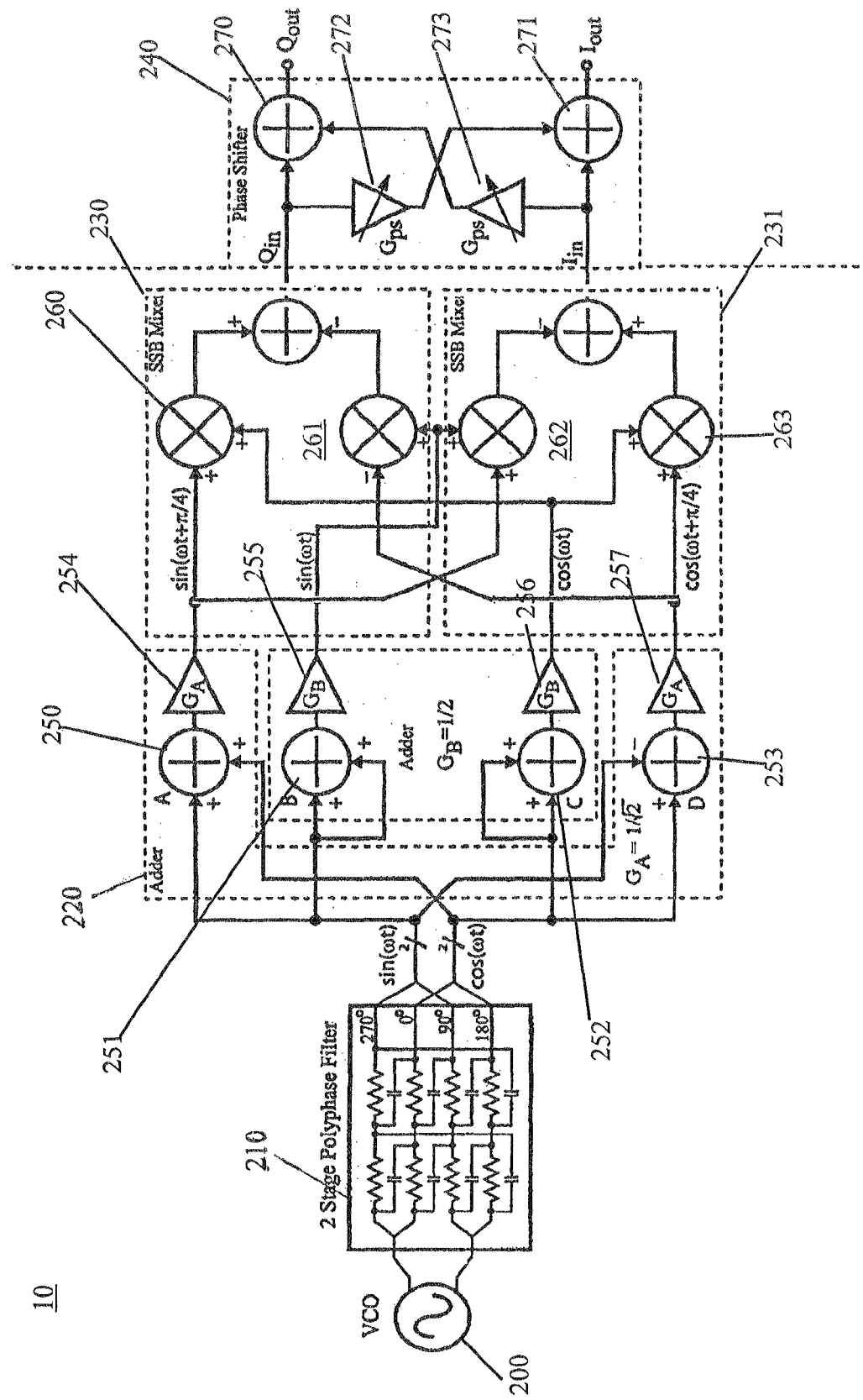
FIG. 4 illustrates an embodiment of the frequency doubling circuit and phase shifter of the present invention.

In the following detailed description, numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

Essentially, the present invention attempts to alleviate problems of the prior art in a manner with little sensitivity to manufacturing deviations, by providing a frequency doubling circuit and method for obtaining quadrature signals, in which inputs of substantially same phase offset are provided to mixers of the provided circuits or, equivalently, are mixed together within the provided method.

FIG. 4 illustrates a representative embodiment of a frequency doubler 10 according to the present invention. Frequency doubler 10 comprises a voltage controlled oscillator (VCO) 200, a polyphase filter 210, an adder block 220 and mixer blocks 230, 231. Preferably, it further comprises a phase shifter 240. A VCO (voltage controlled oscillator) 200 having differential outputs is fed into a polyphase filter 210. In FIG. 4, polyphase filter 210 is a two stage polyphase filter used to generate 2 pairs of differential quadrature signals. However, those skilled in the art are aware that other types of filters, and other circuits are also possible to carry out this function. For example, a quadrature VCO could be used at the expense of increased power consumption and an additional tank circuit. In FIG. 4, the two pairs of differential quadrature signals are: $\sin(\omega t)$ and $-\sin(\omega t)$, and $\cos(\omega t)$ and $-\cos(\omega t)$. These four signals are fed to adder block 220, which creates four $\pi/4$ shifted signals, i.e. signals having their phases separated by 45° (or $\pi/4$). Specifically, these $\pi/4$ shifted signals are represented as $\sin(\omega t)$, $\sin(\omega t+\pi/4)$, $\cos(\omega t)$, and $\cos(\omega t+\pi/4)$. Advantageously, each output from the polyphase filter 210 is equally loaded, that is, each output is connected to the same effective impedance with respect to circuit ground, thereby reducing the phase offset commonly introduced by load imbalance. Within the adder block 220, the four $\pi/4$ shifted signals are generated based on the following trigonometric identities:

$$\sin(\omega t+\pi/4)=(\cos(\omega t)+\sin(\omega t))/\sqrt{2} \quad (1)$$

$$\sin(\omega t)=(\sin(\omega t)+\sin(\omega t))/2 \quad (2)$$

$$\cos(\omega t)=(\cos(\omega t)+\cos(\omega t))/2 \quad (3)$$

$$\cos(\omega t+\pi/4)=(\cos(\omega t)-\sin(\omega t))/\sqrt{2} \quad (4)$$

Within the adder block 220, four adders 250, 251, 252 and 253 and four gain stage 254, 255, 256, 257 are used to implement equations (1)-(4) above. Specifically, adder 250 implements equation (1), and the gain stage 254 is used to reduce the amplitude of the adder 250 output by $1/\sqrt{2}$. Similarly, adder 253 implements equation (4) above. To change the adder into a subtractor, the differential inputs associated with $\sin(\omega t)$ are simply reversed. Adders 251 and 252 implement equations (2) and (3) respectively. Although adders 251 and 252 simply add a signal to itself and then divide it by two, they are advantageously used to match the delays introduced by adders 250 and 253.

Based on the four $\pi/4$ shifted signals, mixer blocks 230 and 231 generate in phase and quadrature outputs, $I_{in}$ and $Q_{in}$, respectively, based the following identities:

$$I_{in}=\cos(2\omega t+\pi/4)=(\cos(2\omega t)-\sin(2\omega t))/\sqrt{2} \quad (5)$$

$$Q_{in}=\sin(2\omega t+\pi/4)=(\cos(2\omega t)+\sin(2\omega t))/\sqrt{2} \quad (6)$$

$$I_{in}=\cos(\omega t)\cos(\omega t+\pi/4)-\sin(\omega t)\sin(\omega t+\pi/4)=(\cos(2\omega t)-\sin(2\omega t))/\sqrt{2} \quad (7)$$

$$Q_{in}=\cos(\omega t)\sin(\omega t+\pi/4)+\sin(\omega t)\cos(\omega t+\pi/4)=(\cos(2\omega t)+\sin(2\omega t))/\sqrt{2} \quad (8)$$

Equations (6) and (8) are implemented by mixer block 230, comprising mixers 260 and 261, while equations (5) and (7) are implemented by mixer block 231 comprising mixers 262 and 263. The inputs to mixers 260, 261, 262 and 263 are all at the same relative phase offset, specifically 45° (or $\pi/4$). This implies that the non-linearity effects will be equal for all of the mixers, resulting in much less amplitude mismatch between the $I_{in}$ and $Q_{in}$ signals, especially as compared to the circuit in FIG. 1b.

Note that the $\cos(\omega t+\pi/4)$ input to mixer 261 is inverted, $-\cos(\omega t+\pi/4)$ being used as input, in order to maintain the required phase offset. The output of mixer 261 is further subtracted from the output of mixer 260 to counter the effect of using $-\cos(\omega t+\pi/4)$ term in mixer 261.

Although the preferred embodiment uses 45° phase offsets for all mixers, it should be noted that this is not essential. The same functionality is achievbed with mixer inputs of arbitrary phase offset θ provided the input phase offset is the same for each of mixers 260, 261, 262 and 263 and the relative phases between each of the four mixers is as given in (5)-(8).

Additionally, in all of these cases, the maximum amplitude output level of the mixers is identical, as is the frequency content. Specifically, each mixer output contains a $\cos(2\omega t)$ component a $\sin(2\omega t)$ component and a DC offset. The outputs of mixers 260 through 263, respectively, can be expressed as follows:

$$(\cos(2\omega t)+\sin(2\omega t)+1)/2\sqrt{2}$$

$$(\cos(2\omega t)+\sin(2\omega t)-1)/2\sqrt{2}$$

$$(-\cos(2\omega t)+\sin(2\omega t)+1)/2\sqrt{2}$$

$$(\cos(2\omega t)-\sin(2\omega t)+1)/2\sqrt{2}$$

FIG. 5 illustrates a representative circuit embodiment of an adder, as used in the adder block 220. In this embodiment, differential pair $V_{in1}$ feeds the bases of transistors M1 and M2. Similarly, the differential pair $V_{in2}$ feeds the bases of transistors M3 and M4. The gain of this adder is defined as $G=R_{LA}/R_{EA}$. Transistors M5 and M6 are emitter followers, used to make the adder insensitive to output loading. Ideally, the gain for adders 250 and 253 should be $1/\sqrt{2}$, and the gain for adders 251 and 252 should be ½. However, more adder gain may be necessary when implementation loss is considered. The load $R_{LA}$ is preferably the same for all four adders, and the gain ratio is set by varying $R_{EA}$ as desired. This minimizes the variation in adder phase shift due to the RC filter formed by the load resistors and the parasitic output capacitances.

While the adder block 220 of FIG. 4, and the implementation of the adder and gain stage shown in FIG. 5 are the preferred embodiment, the invention is not so limited. Those skilled in the art are aware that other circuits can be utilized to create four signals whose phases are in 45° increments.

FIG. 6 shows a representative implementation of mixer elements 230 and 231. Transistors M1 through M4, M9 and M10 form a typical Gilbert mixer, similar to that configuration shown in FIG. 2. Similarly, transistors M5 through M8, M11 and M12 form a second Gilbert mixer. Transistors M15 through M18 are used to create constant current sources. By connecting the collectors of M1, M3, M5 and M7 together, and the collectors of M2, M4, M6 and M8 together, the outputs of these two mixers are then summed. A tuned load is not required since the input signal phases are such that no DC offset will be output by the circuit. Preferably, Ports A through D are biased with four separate high pass RC filter networks. Although the adder outputs (such as driven by the circuit of FIG. 5) will have a common mode level suitable to drive ports A and D, ports B and C require level shifting to a higher voltage. (Note the higher DC offset required for the transistors M1 through M4 in the Gilbert mixer of FIG. 2). Any level shifter used for ports B and C will introduce phase shift that must be matched at ports A and D. Alternatively, two sets of followers, one for each common mode level required, could be used at the expense of power consumption and increased common mode voltage mismatch. To minimize the effects of output loading, transistors M13 and M14 are used as emitter followers.

In summary, within frequency doubler 10, VCO 200, polyphase filter 210, adder block 220 and mixer blocks 230 and 231 combine to create quadrature outputs $Q_{in}=\sin(2\omega t+\pi/4)$ and $I_{in}=\cos(2\omega t+\pi/4)$ having far less amplitude mismatch between them, compared to prior art circuits, due to producing 45° shifted signals and using them as inputs to mixer blocks 230 and 231 as described above.

In the preferred embodiment of FIG. 4, the polyphase filter 210 is the largest source of phase error. In an alternate embodiment, lower phase errors can be achieved when a quadrature VCO topology is used. In such a case, there would be no need for polyphase filter 210, as the outputs from a quadrature VCO can be used directly as the inputs to adder block 220. The consequence of this is an additional resonant tank circuit, regenerative cell and power consumption.

It is possible to further reduce the phase error introduced, using the phase shifter 240 shown in FIG. 4. With careful layout, the typical quadrature output phase error will be less than 1°. Thus, some means of achieving programmable phase shifts on the order of ±5° are required to compensate for phase errors caused by device mismatch as well as variations in process, temperature and supply voltage.

As described above, the output from mixer element 230 is $Q_{in}=\sin(2\omega t+\pi/4)$, while the output from mixer element 231 is $I_{in}=\cos(2\omega t+\pi/4)$. Assume that the phase error between the quadrature signals is represented by θ. To bring these signals back to exactly 90° separation, the phase of one signal can be increased by θ/2, while the phase of the other signal can be decreased by θ/2. Thus, the required outputs from the phase shifter can be expressed as:

$$Q_{out}=\sin(2\omega t+\pi/4+\theta/2)$$

$$I_{out}=\cos(2\omega t+\pi/4-\theta/2)$$

Expanding the above expressions yields:

$$Q_{out}=\sin(2\omega t+\pi/4)\cos(\theta/2)+\cos(2\omega t+\pi/4)\sin(\theta/2)$$

$$I_{out}=\cos(2\omega t+\pi/4)\cos(\theta/2)+\sin(2\omega t+\pi/4)\sin(\theta/2)$$

At very small values of ω(consistent with small phase errors), it can be approximated that $\sin(\theta) \sim \theta$, and $\cos(\theta) \sim 1$. Thus, these expressions can be rewritten as:

$$Q_{out}=\sin(2\omega t+\pi/4)+\cos(2\omega t+\pi/4)(\theta/2)$$

$$I_{out}=\cos(2\omega t+\pi/4)+\sin(2\omega t+\pi/4)(\theta/2)$$

Renaming the terms in the above equations yields:

$$Q_{out}=Q_{in}+I_{in}(\theta/2)$$

$$I_{out}=I_{in}+Q_{in}(\theta/2)$$

Therefore, the required phase shift can be introduced by adding a small fractional portion of the quadrature signal to the inphase signal and vice versa. This is illustrated in phase shifter 240 of FIG. 4. Iin passes through a gain stage 273, and the resulting output is then added to Qin as shown in adder 270 to generate $Q_{out}$. Similarly, $Q_{in}$ passes through a gain stage 272, and the resulting output is then added to $I_{in}$ as shown in adder 271 to generate $I_{out}$.

FIG. 7 shows the preferred embodiment of the phase shifter 240 of FIG. 4. $Q_{in}$ feeds the bases of transistors Q1 and Q2. The collectors of these transistors are connected to a power rail through matched resistors, RL. The collector of Q1 is also connected to the collectors of Q3 and Q5, while the collector of Q2 is connected to the collectors of Q4 and Q6. The bases of Q3 and Q6 are fed by one polarity of $I_{in}$, while the bases of Q4 and Q5 are fed by the opposite polarity of $I_{in}$. Thus, transistor pairs Q3/Q4 and Q5/Q6 are set up as a subtraction circuit, such that Q3/Q4 adds a first portion of $I_{in}$ to Qin, while Q5/Q6 subtracts a second portion of $I_{in}$ from $Q_{in}$. Rather than having a constant current source, the emitters of Q3 through Q6 are connected to a variable current source. A voltage is applied to the collector and base of transistor Q7, which generates a specific current. Transistors Q8 and Q17 are set up as current mirrors. In the preferred embodiment, Rd2 is larger than the value of Rd1. Thus, the current passing through Q8 and Q17 is a portion of the current passing through Q7. Alternatively, instead of using a ratio of base resistors to create the necessary small current flows, a smaller voltage can be delivered from the DAC.

A similar current mirror also exists with transistors Q9, Q10 and Q18. In the case where the voltage applied to the base of Q7 is equal to that of Q10, the outputs from the transistor pairs cancel, thus leaving $Q_{out}=Q_{in}$. However, if the voltage applied to the base of Q7 is slightly greater than that applied to the base of Q10, the net result is that a small portion of the $I_{in}$ signal will be added to $Q_{in}$. Conversely, if the voltage applied to the base of Q7 is slightly smaller than that applied to the base of Q10, the net result is that a small portion of the $I_{in}$ signal will be subtracted from $Q_{in}$. For the lower transistor quad, if the voltage applied to the base of Q7 is slightly greater than that applied to the base of Q10, the net result is that a small portion of the $Q_{in}$ signal will be added to $I_{in}$. Conversely, if the voltage applied to the base of Q7 is slightly smaller than that applied to the base of Q10, the net result is that a small portion of the $Q_{in}$ signal will be subtracted from $I_{in}$.

In the preferred embodiment, these voltages applied to the bases of Q7 and Q10 are created using a DAC (digital-analog converter). However, those skilled in the art will appreciate that other methods of generating variable currents are well known and the present invention is not limited to this embodiment. For example, in another embodiment, an analog feedback loop may be used to autozero the phase error.

In the preferred embodiment shown in FIG. 7, a static 5-bit current steering DAC is used to create binary weighted currents, $\Delta I$ and $-\Delta I$, which are added to a constant bias current $I_{DAC}$. A small phase step and adequate range is desirable if the doubler is used to provide the oscillator for a single sideband mixer. If the tuning range is too wide and discrete steps are used, the reciprocal dependence of the mixer sideband rejection on phase error can considerably lower the average achievable sideband rejection.

The phase shifter is a major source of amplitude variation and harmonic distortion due to the non-linear input pairs Q1, Q2 and Q11, Q12. This configuration yields the tan h relationship described above. If a constant output level is desired, these input pairs can be degenerated by the addition of resistors between the emitters of these transistors and the constant current source IB.

FIG. 8 illustrates some advantages provided by embodiments of the present invention, such as the circuits in FIGS. 4-7 (with corresponding curves referred to as "proposed" in the drawing) with respect to the circuit in FIG. 1b (with corresponding curves referred to as "Topology B", in the drawing). The horizontal axis of the three graphs represents the VCO drive level, expressed as volts peak differential. The vertical axis of the bottom graph represents phase error in degrees, the middle graph represents output level in dB, while the horizontal axis of the top graph represents the amplitude mismatch between the quadrature signals, expressed in dB.

Calibration of the circuit in FIG. 7 is possible, even during normal operation. Amplitude mismatch and phase error of the quadrature signals affect the amplitude of the image frequency in full-duplex wireless circuits. Therefore, by monitoring the amplitude of the image frequency transmitted, the circuit can determine the optimal setting for the phase shifter circuit. Specifically, the amplitude of the image frequency is sampled, such as by a baseband processor. The phase offset is then altered, preferably by changing the DAC input. The amplitude is then sampled again. This process can be repeated for each possible value of the DAC. Once this has been completed, the system can determine which DAC value, and therefore which phase setting, created the image frequency with the smallest amplitude. This value is then stored in the DAC and used. This calibration routine can be performed once, such as when power is first applied to the device, or can be performed periodically to adapt to changes in operating conditions.

Referring first to the top graph of FIG. 8, it can be seen that the circuit shown in FIG. 1b has only one VCO drive level at which the quadrature signals have equal amplitude. Thus, the VCO input level needs to be tightly controlled for this circuit. Also, referring to the bottom graph, at VCO input levels above 0.3V, the phase error of the circuit in FIG. 1b increases proportional to the input amplitude. In contrast, embodiments of the invention according to the circuits in FIGS. 4-7 demonstrates substantially no amplitude mismatch or phase error over the entire range of VCO input voltages. In addition, the output level for the "proposed" circuits is constant at VCO input levels greater than 0.18V.

In the preferred embodiment, the frequency doubling circuit and the phase shifter are incorporated into a single integrated circuit. This integrated circuit is then utilized in wireless communication products, such as wireless access points.

Although the present invention has been described in considerable detail with reference to certain preferred embodiments thereof, other versions are possible. Therefore, the spirit and scope of the appended claims should not be limited to the description of the preferred embodiments contained herein.

What is claimed:

1. A frequency doubler circuit comprising:
an adder block for producing a plurality of intermediate phase shifted signals of frequency ω based on input differential quadrature signals of frequency ω; and
a first mixer block and a second mixer block for receiving said plurality of intermediate phase shifted signals, said first mixer block producing in-phase signal $I_{in}$ of frequency 2ω and said second mixer block producing quadrature signal $Q_{in}$ of frequency 2ω,
wherein said plurality of phase shifted signals include four π/4 phase shifted signals.

2. A frequency doubler circuit comprising:
an adder block for producing a plurality of intermediate phase shifted signals of frequency ω based on input signals of frequency ω; and
a first mixer block and a second mixer block for receiving said plurality of intermediate phase shifted signals, said first mixer block producing in-phase signal $I_{in}$ of frequency 2ω and said second mixer block producing quadrature signal $Q_{in}$ of frequency 2ω,
wherein said mixing blocks comprise a plurality of mixers, each of said mixers adapted to receive two of said plurality of phase shifted intermediate signals separated in phase by (180n+45)°, where n is an integer.

3. The frequency doubler of claim 2, wherein n is the same for all of said mixer blocks.

4. The frequency doubler of claim 2, wherein n is 0 for all of said mixer blocks.

5. The frequency doubler of claim 2, wherein n is not the same for all of said mixer blocks.

6. The frequency doubler of claim 2, wherein said adder block comprises a plurality of adders and gain stages.

7. The frequency doubler of claim 2, wherein said adder block is adapted to receive two pairs of differential input sinusoidal signals in quadrature.

8. The frequency doubler of claim 2, wherein said adder block is adapted to receive one pair of differential input signals and further comprises a third circuit adapted to receive said differential pair and generate two differential pairs of quadrature sinusoidal signals.

9. The frequency doubler of claim 8, wherein said third circuit comprises a polyphase filter.

10. The frequency doubler of claim 8, wherein said third circuit comprises an allpass filter.

11. The frequency doubler of claim 2, wherein said plurality of intermediate outputs comprises four signals, wherein the second of said signals is separated from the first of said signals in phase by $(180j+45)°$, the third is separated from said second in phase by $(180k+45)°$, the fourth is separated from said third in phase by $(180l+45)°$, and the fourth is separated from the first in phase by $(180m+45)°$, where j, k, l, and m are integers.

12. A device adapted to receive two input sinusoidal signals, having an initial phase offset between them, and adapted to generate two output signals, wherein the phase offset between said output signals differs from said initial phase offset mental amount, said device comprising:
a first circuit, adapted to sum the first of said input signals and a selectable portion of the second of said input signals, to generate a first of said output signals;
a second circuit, adapted to sum said second input signal and a selectable portion of said first input signal, to generate a second of said output signals; and
two gain elements, each of said gain elements adapted to receive one of said input signals, and having a selectable gain, wherein the absolute value of said gain is less than 1, the output of each of said gain elements comprising said selectable portion.

13. The device of claim 12, further comprising a digital to analog converter in communication with said gain elements, adapted to select the gain of said gain elements.

14. A method of minimizing the magnitude of the image frequency in a wireless communication device having a receiver and a transmitter, wherein two quadrature signals are used to generate the desired transmission frequency, said method comprising the steps of:
providing a phase shifting circuit, said circuit comprising a first circuit adapted to sum a first input signal and a selectable portion of a second input signal to generate a first of said two quadrature signals; a second circuit adapted to sum said second signal and said selectable portion of said first signal to generate a second of said two quadrature signals; programmable means for selecting said portion, wherein said portion is selected from a range of values; and a mixer, adapted to receive said two quadrature signals and a second set of differential signals at a second frequency and produce said transmission frequency; selecting a first value for said portion from said range;
transmitting at said transmission frequency;
measuring the magnitude of said image frequency;
selecting a different value for said portion from within said range of values;
repeating said transmitting, measuring and selecting steps until all values within said range have been selected and transmitted; and
choosing said value at which said magnitude of said image frequency is smallest.

15. The method of claim 14, wherein said steps are performed once when power is first applied to said wireless device.

16. The method of claim 14, wherein said steps are performed periodically.

17. A wireless communications device having a receiver and a transmitter, wherein two quadrature signals are used to generate the desired transmission frequency, comprising:
a first circuit adapted to receive at least one differential pair of sinusoidal input signals at a given frequency and generate a plurality of intermediate sinusoidal output signals at said frequency; and a second circuit adapted to receive said intermediate output signals and to generate said two quadrature signals at twice said frequency, said second circuit comprising a plurality of mixers, each of said mixers adapted to receive two of said plurality of intermediate output signals, where said two signals are separated in phase by $(180n+45)°$, where n is an integer.

* * * * *

UNITED STATES PATENT AND TRADEMARK OFFICE
CERTIFICATE OF CORRECTION

PATENT NO.         : 7,978,785 B2                                       Page 1 of 1
APPLICATION NO.    : 11/677400
DATED              : July 12, 2011
INVENTOR(S)        : Leifso It is certified that error appears in the above-identified patent and that said Letters Patent is hereby corrected as shown below:

Claim 2, Col. 8, line 55 "input signals" should be --input differential quadrature signals--.

Signed and Sealed this
Twelfth Day of March, 2013

Teresa Stanek Rea
*Acting Director of the United States Patent and Trademark Office*